United States Patent

Young et al.

[11] Patent Number: 5,851,294
[45] Date of Patent: Dec. 22, 1998

[54] GAS INJECTION SYSTEM FOR SEMICONDUCTOR PROCESSING

[75] Inventors: Lydia J. Young, Palo Alto; Richard H. Matthiesen, Scotts Valley; Simon Selitser, Fremont; Ron van Os, Sunnyvale, all of Calif.

[73] Assignee: Watkins-Johnson Company, Palo Alto, Calif.

[21] Appl. No.: 928,747

[22] Filed: Sep. 12, 1997

Related U.S. Application Data

[63] Continuation of Ser. No. 546,885, Oct. 23, 1995.
[51] Int. Cl.⁶ .......................... C23C 16/00; C23C 14/00
[52] U.S. Cl. .................. 118/715; 204/298.07; 156/345
[58] Field of Search ...................... 118/715; 204/298.07; 156/345

[56] References Cited

U.S. PATENT DOCUMENTS

| | | | |
|---|---|---|---|
| 4,369,031 | 1/1983 | Goldman | 432/198 |
| 4,446,815 | 5/1984 | Kalbskopf et al. | 118/718 |
| 4,499,853 | 2/1985 | Miller | 118/725 |
| 4,537,795 | 8/1985 | Nath et al. | 427/39 |
| 4,590,042 | 5/1986 | Drage | 422/186.06 |
| 4,795,529 | 1/1989 | Kawasaki et al. | 156/643 |
| 4,817,558 | 4/1989 | Itoh | 118/725 |
| 4,834,020 | 5/1989 | Bartholomew et al. | 118/719 |
| 4,948,458 | 8/1990 | Ogle | 156/643 |
| 4,986,216 | 1/1991 | Ohmori et al. | 118/730 |
| 4,990,229 | 2/1991 | Campbell et al. | 204/298.06 |
| 4,992,665 | 2/1991 | Möhl | 250/423 |
| 5,105,761 | 4/1992 | Charlet | 118/723 |
| 5,122,251 | 6/1992 | Campbell et al. | 204/298.06 |
| 5,134,965 | 8/1992 | Tokuda et al. | 118/723 |
| 5,221,556 | 6/1993 | Hawkins et al. | 427/255 |
| 5,232,508 | 8/1993 | Arena et al. | 118/719 |
| 5,280,154 | 1/1994 | Cuomo et al. | 219/121.52 |
| 5,290,993 | 3/1994 | Kaji et al. | 219/121.43 |
| 5,304,247 | 4/1994 | Kondo | 118/715 |
| 5,328,722 | 7/1994 | Ghanayem et al. | 427/250 |
| 5,336,326 | 8/1994 | Karner et al. | 118/723 |
| 5,368,646 | 11/1994 | Yasuda et al. | 118/723 R |
| 5,368,710 | 11/1994 | Chen et al. | 204/192.36 |
| 5,391,232 | 2/1995 | Kanai et al. | 118/715 |
| 5,468,298 | 11/1995 | Lei et al. | 118/728 |
| 5,551,982 | 9/1996 | Anderson | 118/715 |
| 5,551,985 | 9/1996 | Brors | 118/725 |
| 5,614,055 | 3/1997 | Fairbairn et al. | 156/345 |

FOREIGN PATENT DOCUMENTS

| | | | |
|---|---|---|---|
| 0 379 828 A2 | 12/1989 | European Pat. Off. | H01J 37/32 |
| 54-111771 | 9/1979 | Japan | 118/715 |
| 62-120477 | 6/1987 | Japan | 118/723 |
| 2-234419 | 9/1990 | Japan | 118/723 |
| 598630 | 2/1978 | U.S.S.R. | |

*Primary Examiner*—R. Bruce Breneman
*Assistant Examiner*—Jeffrie R. Lund
*Attorney, Agent, or Firm*—Flehr Hohbach Test Albritton & Herbert LLP

[57] ABSTRACT

A system for injecting a gaseous substance into a semiconductor processing chamber. The injection system includes at least one plenum formed in a plenum body and a plurality of nozzles associated with each plenum for injecting gaseous substances from the plenums into the chamber. A conduit structure transports gaseous substances along an indirect path from the plenum to the nozzles. The nozzles are positioned and configured to provide a uniform distribution of gaseous substances across the wafer surface.

22 Claims, 4 Drawing Sheets

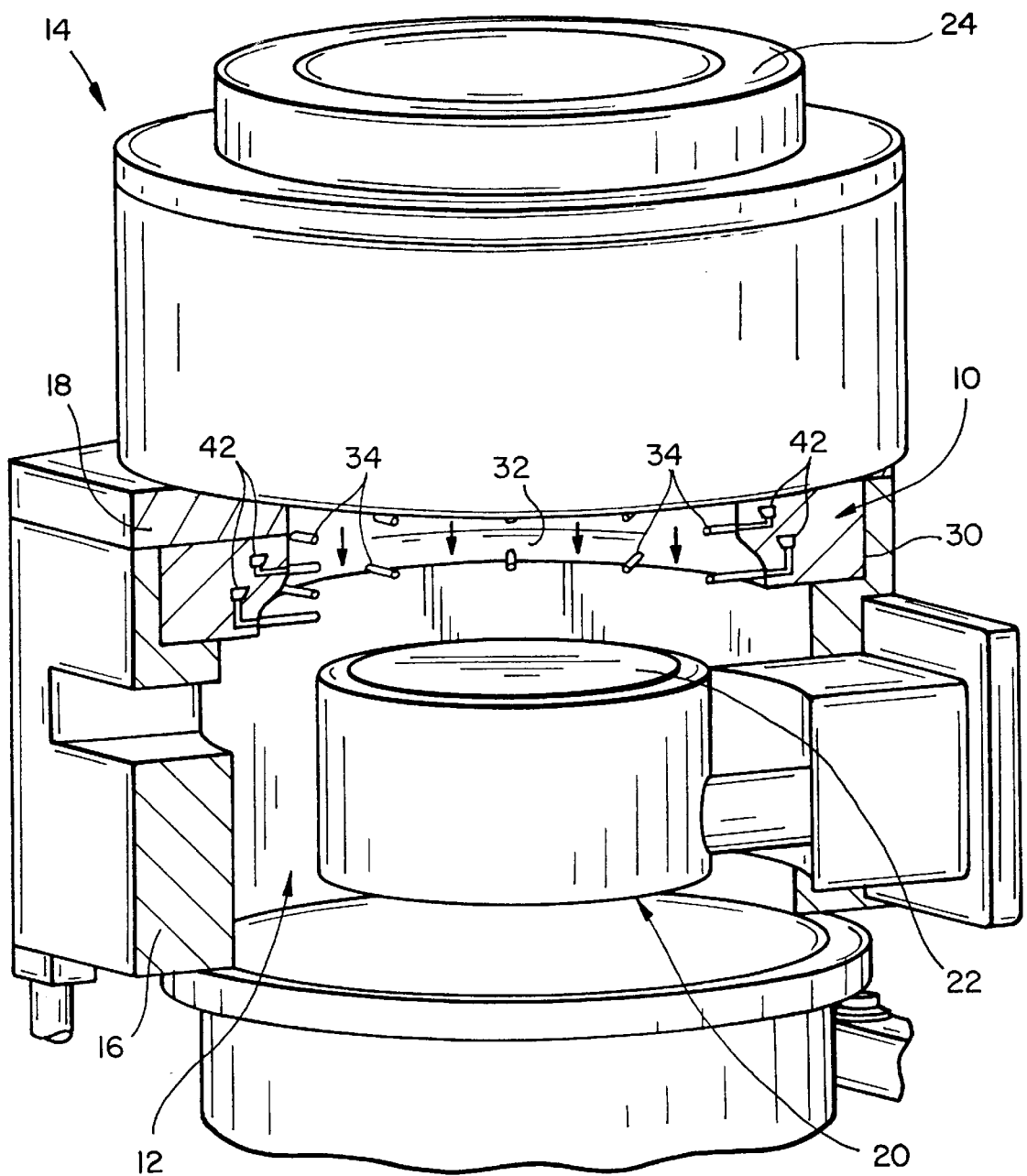
FIG_1

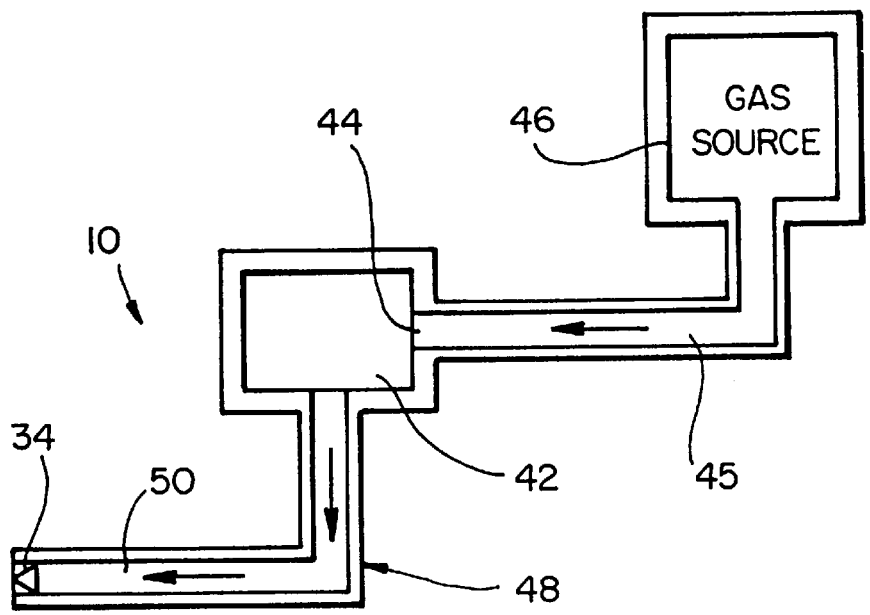
FIG_2
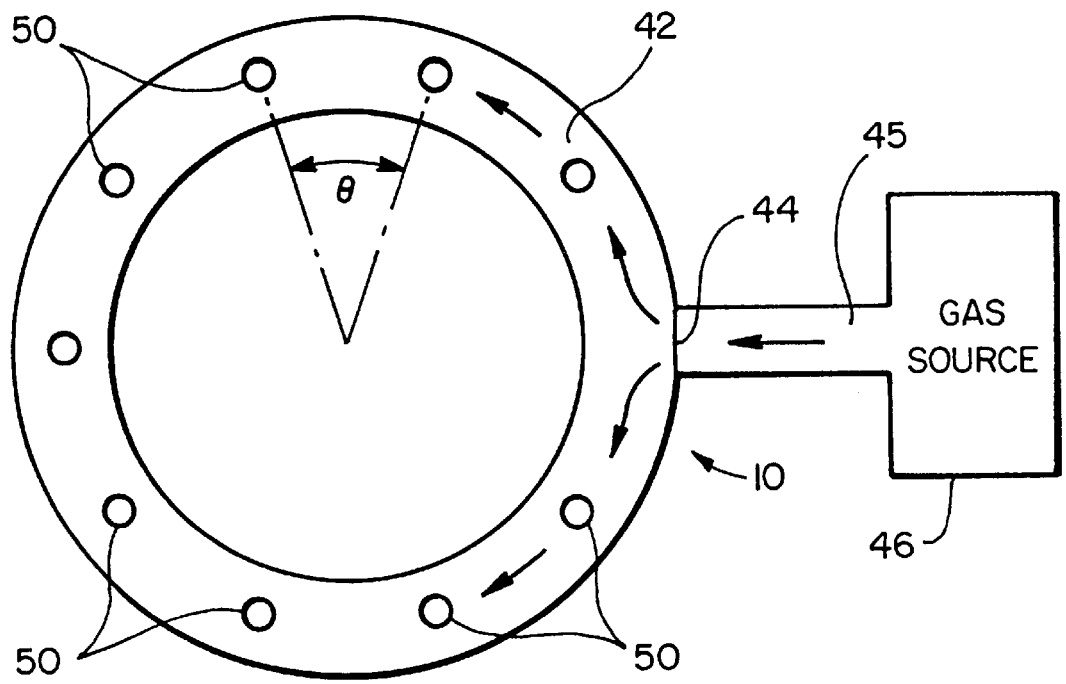
FIG_3

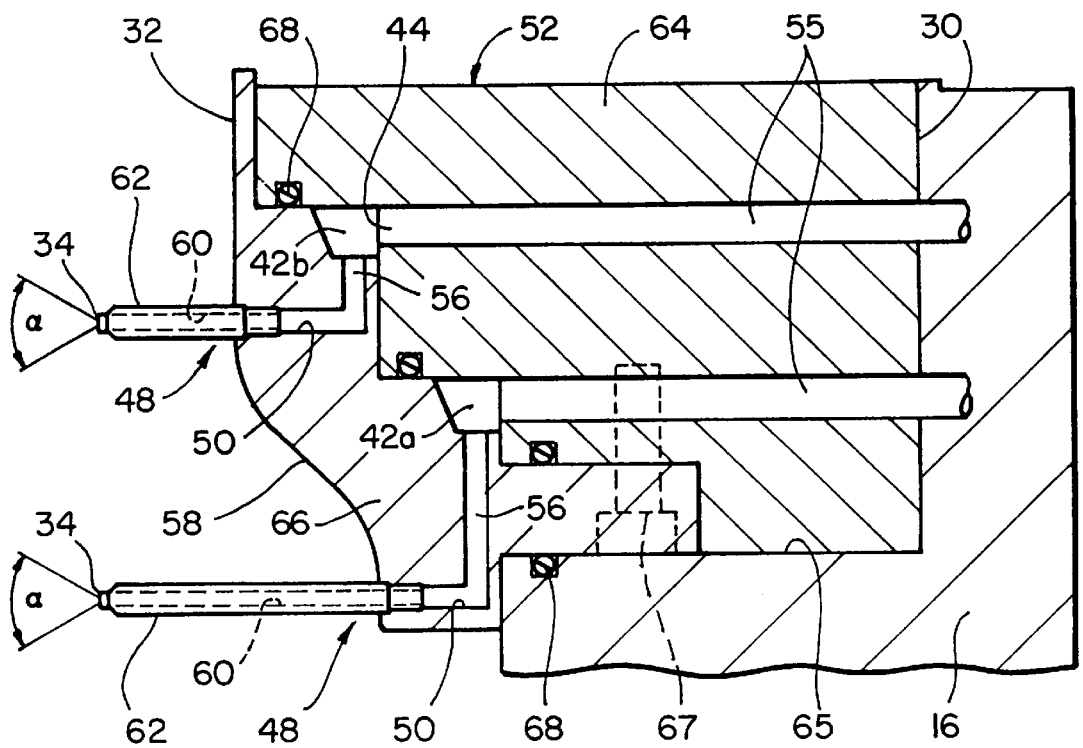
FIG_4
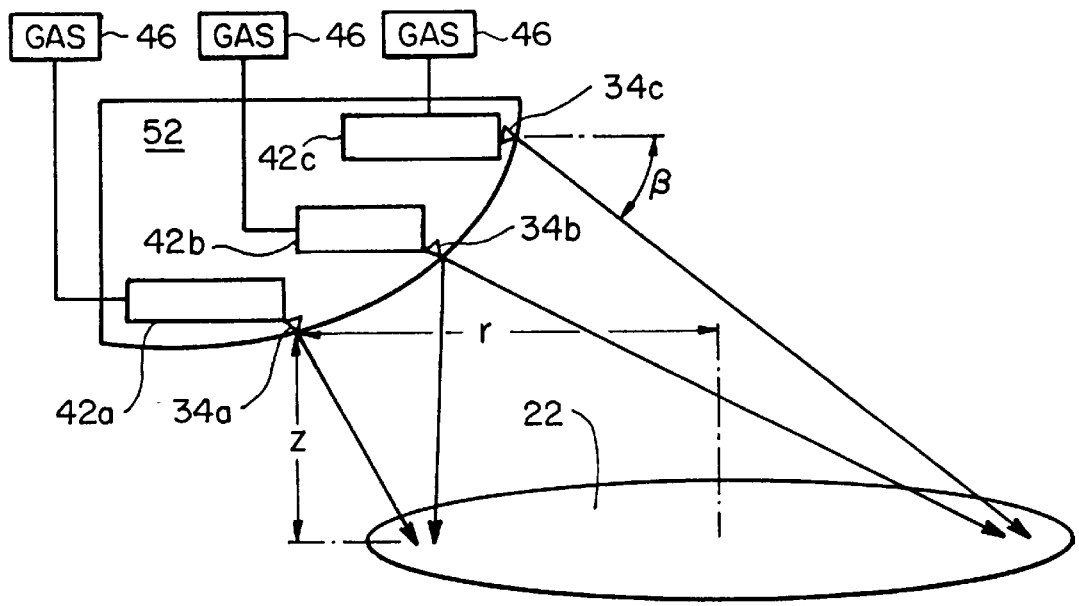
FIG_5

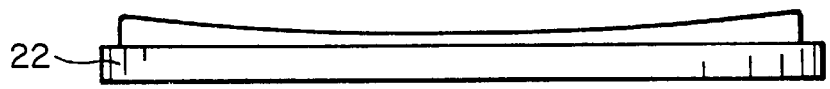
FIG_6A
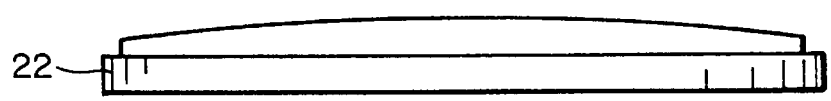
FIG_6B
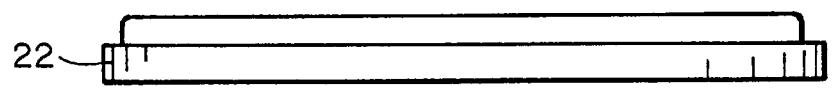
FIG_6C
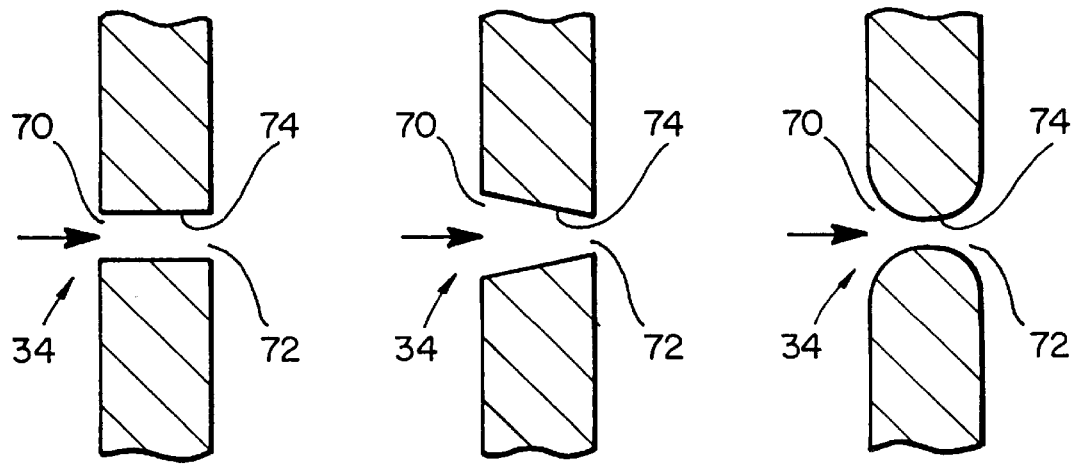
FIG_7A  FIG_7B  FIG_7C

GAS INJECTION SYSTEM FOR SEMICONDUCTOR PROCESSING

This is a continuation of application Ser. No. 08/546,885 filed Oct. 23, 1995.

BRIEF DESCRIPTION OF THE INVENTION

This invention relates in general to a system for distributing gaseous substances and, more particularly, to a gas injection system for semiconductor processing.

BACKGROUND OF THE INVENTION

The processing of semiconductor wafers is typically accomplished by positioning the wafer in a chamber and subjecting the surface of the wafer to various chemical substances. The chemistry of the substances depends upon the type of processing employed as well as the nature of the devices formed on the surface of the semiconductor wafer. The chemical substances are generally delivered to the chamber either in gaseous form or with a carrier gas. With some processes, the formation of the film layers on the wafer surface is enhanced using high density plasma.

Gas distribution devices used to supply the chemical substances to the chamber typically include a plenum coupled to a gas supply and a plurality of nozzles for injecting the gases from the plenum into the chamber. Typically, the back pressure of the plenum is highest near the injection point of the gas supply. As a result, the nozzles closest to the injection point will supply the gas at a higher flow rate than the nozzles remote from the supply inlet. For optimum film quality, it is generally desirable that the gas distribution device provide a substantially uniform distribution of gas across the surface of the wafer. The distribution apparatus may have fewer, smaller nozzles positioned near the supply inlet to reduce the amount of gas entering the chamber near the supply inlet to the plenum. In order to attain greater uniformity of gas flow from the plenum into the chamber, some gas distribution devices include a baffle which divides the plenum into two chambers to provide a more uniform distribution of gas throughout the plenum before the gases reach the nozzles. While the distribution of gas within the plenum is improved, the addition of the baffle increases the cost and complexity of the device and requires the use of additional seals. A gas distribution apparatus which provides a substantially uniform supply of gases without the use of baffles or diffusion plates is desirable.

The nozzles of available gas distribution devices are typically configured to inject the gaseous substances in the general direction of the wafer. As the complexity and packaging density of integrated circuits increases, the uniformity of the film formed on the wafer surface is becoming of greater importance. The rate of film development radially across the wafer surface depends upon such factors as the gas flow rate and the position and orientation of the nozzle relative to localized areas of the wafer surface. A gas distribution apparatus in which the nozzles are arranged to produce a substantially uniform layer of film on the wafer surface is desirable.

Nozzle design plays an important role in providing a uniform distribution of gas and controlling the flow of the gaseous substance into the chamber. For plasma-enhanced deposition processes, a high flow rate is preferred to reduce the time required to complete the processing. A nozzle which may be used to provide subsonic, sonic and supersonic flow of the gaseous substance is desirable.

OBJECTS AND SUMMARY OF THE INVENTION

It is a primary object of this invention to provide a gas injection system for delivering gaseous substances to a processing chamber.

It is a further object of the invention to provide a gas injection system for injecting gaseous substances into the processing chamber at a uniform flow rate.

It is another object of the invention to provide a gas injection system having a substantially uniform back pressure throughout the plenum.

It is yet another object of the invention to provide a gas injection system which supplies a substantially uniform distribution of gas.

It is another object of the invention to provide a gas injection system for developing a film having a substantially uniform profile on the wafer surface.

It is still another object of the invention to provide a nozzle which is particularly suitable for high density plasma enhanced deposition processes.

A more general object of the invention is to provide a gas injection system which may be efficiently and economically manufactured, installed and maintained.

In summary, this invention provides a gas injection system which is particularly suitable for delivering a gaseous substance to a processing chamber. The gas injection system includes a plenum body having at least one plenum formed therein and a plurality of nozzles for injecting gaseous substances into said processing chamber. The nozzles are spaced from the plenum. A conduit structure extends between said plenum and said nozzles for transporting said gaseous substance along an indirect path from said plenum to said nozzles. The nozzles are positioned and configured to provide a uniform distribution of gaseous substances across the wafer surface.

Additional objects and features of the invention will be more readily apparent from the following detailed description and appended claims when taken in conjunction with the drawings.

BRIEF DESCRIPTION OF THE DRAWINGS

FIG. 1 is a schematic perspective view, partially broken away, of a gas injection system in accordance with this invention, shown installed in a plasma-enhanced chemical vapor deposition system.

FIG. 2 is a schematic sectional view of a gas injection system in accordance with this invention.

FIG. 3 is a schematic top plan view of the main plenum of the gas injection system of FIG. 2.

FIG. 4 is a cross sectional view of the gas injection system of FIG. 1.

FIG. 5 is a schematic sectional view of a gas injection system in accordance with this invention.

FIGS. 6A–C are enlarged, schematic views of a film profile on a semiconductor wafer during film development.

FIGS. 7A–C are enlarged, cross sectional views of the profile of nozzles in accordance with this invention.

DETAILED DESCRIPTION OF THE INVENTION

Reference is now made in detail to the preferred embodiment of the invention, which is illustrated in the accompanying figures. Turning to the drawings, wherein like components are designated by like reference numerals throughout the various figures, attention is directed to FIG. 1.

FIG. 1 shows a gas injection assembly 10 which is particularly suitable for delivering a gaseous substance to a chamber 12 of processing system 14. Processing system 14 is used for plasma-enhanced chemical vapor deposition processing, although it is to be understood that the injection assembly 10 may also be used with other processes on the wafer including, but not limited to, chemical vapor deposition, etching, high temperature film deposition, and the like. Processing system 14 generally includes a chamber wall 16 and a top plate 18 enclosing the chamber 12. A support assembly 20 supports a wafer 22 within the chamber 12 for processing. In the preferred embodiment, the support assembly 20 is an electrostatic clamp assembly of the type disclosed in co-pending application Ser. No. 08/500,480, the disclosure of which is incorporated herein by reference. However, other types of support systems such as a mechanical clamping chuck may be used if desired. A plasma source 24 mounted to the top plate 18 and substantially axially aligned with the wafer 22 generates a supply of plasma for enhancing the processing of the wafer 22. Plasma source 24 is described in detail in co-pending application Ser. No. 08/500,493, the disclosure of which is incorporated herein by reference. A vacuum system (not shown) is provided for exhausting the chamber 12. As is known in the art, the vacuum system generally includes a vacuum pump (not shown) which is operatively coupled to the chamber 12 by a port (not shown). As is described in the application Ser. No. 08/500,493, the vacuum pump may be substantially axially aligned with chamber 12 for improved flow control of the gases and plasma. Alternatively, the vacuum pump may be positioned to the side of chamber 12 as is known in the art.

Gas injection assembly 10 is mounted to the chamber wall 16 below the top plate 18. In the present embodiment, the injection assembly has an annular configuration, with the outer peripheral surface 30 of the system being mounted to the chamber wall and the inner surface 32 defining a central opening which extends through the injection assembly. A plurality of nozzles 34 inject gas into the processing chamber, with the gaseous substances traveling inwardly from the injection assembly toward the central axis of the chamber. The annular configuration of the gas injection assembly uniformly distributes the gases around the circumference of the chamber while providing a passageway between the plasma source 24 and the wafer 22. Separating the injection assembly 10 from the flow of plasma also provides for independent control over the plasma density and the flow of the gaseous substances. As is indicated by the arrows in FIG. 1, the plasma generated by the source 24 and the active species of the gaseous substance move downwardly onto the wafer surface in the RF field created between the injection assembly 10, chamber wall 16 and the support system 20, depositing a layer of film on the wafer.

Although the annular configuration of gas injection assembly 10 is preferred, it is to be understood that other configurations are within the scope of the invention. For example, the injection assembly may have a rectangular or oval configuration if desired. Instead of one injection assembly which extends continuously around the circumference of the chamber, one or more arcuate injection devices may be employed if desired.

The gas injection assembly is of particular advantage in high-density, plasma enhanced processing because of the effects on the gas flow of factors such as the high density of the plasma, the low pressure of the processing chamber (less than 3–4 mTorr for high density plasma enhanced processes compared to more than 100 mTorr for conventional plasma-enhanced systems), and the relatively high energy of the electrons. Because of the lower chamber pressure, the gaseous substances are moved by convection flow rather than free molecular flow.

Gas injection assembly 10 of this invention provides optimum control over the tangential profile (the thickness around the circumference of the wafer) and the radial profile (the thickness radially across the wafer) of the film deposited on the wafer surface. Variations in the tangential profile are obtained when the gases are injected by the nozzles 34 at different flow rates. The dispersion angle $\alpha$ (FIG. 4) and the injection angle $\beta$ (FIG. 5) relative to a horizontal plane create variations in the radial profile. The assembly 10 of this invention may be used to optimize the uniformity of the tangential and radial profiles of the film.

The control over the tangential profile will be discussed in relation to FIGS. 2–3. Gas injection assembly 10 generally includes at least one main plenum 42 which is coupled via inlet 44 and supply line 45 to a gas source 46. The main plenum 42 is coupled to nozzles 34 by a conduit structure, generally designated 48 in FIG. 2, which is configured to equalize the back pressure of the plenum so that the nozzles 34 inject gas into the chamber 12 at a substantially uniform flow rate. As is shown for example in FIG. 2, conduit structure 48 defines an indirect path between the main plenum 42 and the nozzles 34. Preferably, conduit structure 48 includes a plurality of separate channels or passageways 50 extending from the main plenum 42 to the nozzles. In this embodiment, a separate channel 50 is employed for each nozzle 34, although if desired the same channel may join two or more nozzles to the main plenum 42. The cross sectional area of each channel is smaller than the cross sectional area of the plenum, which is preferably less than 1000 times the sum total of the cross sectional areas of the nozzles 34.

As is indicated by the arrows in FIGS. 2 and 3, the velocity vector of the gas flow is redirected at least two times from the initial flow direction in the main plenum 42 before it reaches the nozzles 34. Preferably, the conduit structure 48 is configured to produce sharp changes of direction as is demonstrated by the right corners shown in FIG. 2. The degree of redirection required for a particular application will vary depending upon such factors as the angle between channels, the diameter of the channels and the length of the channels. In preferred embodiments of the invention, the size of the channels are related to the mean free path of the gas molecules, with the channel diameter being less than the mean free path and the channel length being on the order of two or three times the mean free path. It is to be understood that the actual path defined by the conduit structure 48 is subject to considerable variation.

Using conduit structure 48 to separate the nozzles 34 from the flow path in the main plenum 42 allows the back pressure of the main plenum 42 to equalize before the gas flow reaches the nozzles. Because of the indirect path between the plenum 42 and the nozzles 34 and the reduced cross sectional area of the channels 50 relative to the main plenum, the gases essentially travel from the main plenum to the nozzles by diffusion. As a result, the ease with which the gases reach a selected injection point is independent of the position of the injection point relative to inlet 44. Each of the nozzles 34 injects gases into the chamber at a substantially uniform flow rate, significantly reducing variations in the tangential profile of the film deposit.

Gas injection assembly 10 will be described in greater detail in relation to FIG. 4. As is shown particularly in FIG. 4, injection assembly 10 generally includes a plenum body 52 in which the main plenum 42 is formed. Two plenums 42a and 42b are formed in the plenum body 52, although it is to be understood that any number of plenums 42 may be used in accordance with this invention. For high-density plasma enhanced chemical vapor deposition processing, plenum 42a is preferably attached to a source of silane and argon while plenum 42b is preferably attached to a source of oxygen. A gas supply channel 55 extends between the supply line and inlet 44 to supply the plenum 42 with the gaseous substance. The supply line 55 is substantially horizontal in the embodiment, although it is to be understood that the supply line may also have a vertical or angled orientation relative to the plenum 42. One or more supply lines 55 may be used to transport the gaseous substance to the plenum. With conduit structure 48, one supply line will provide a substantially uniform distribution of gas within the plenum 42.

Channels 50 include a first stretch 56 formed in a downward extension 58 of plenum body 52 and a second stretch 60 which terminates in a plurality of separate, circumferentially spaced fingers 62 mounted to the downward extension 58 of the plenum body. The fingers 62 are attached to the plenum body 52 using suitable securement means. For example, the fingers 62 may be press fit or threaded into holes formed in the plenum body 52. The cooperative engagement between the plenum body 52 and fingers 62 may be sufficient to minimize or substantially eliminate leakage between the plenum body and the fingers 62. If desired, the junction between the body 52 and the fingers 62 may be sealed. In this embodiment, the first and second stretches 56 and 60 are perpendicular with the first stretch 56 having a substantially vertical orientation and the second stretch 60 having a substantially horizontal orientation. However, the relative orientation of the stretches 56 and 60 is subject to considerable variation within the scope of this invention. Second stretch 60 terminates in nozzle 34.

The configuration of the conduit structure 48 of this embodiment is of particular advantage. The minimum inner diameter of the plenum body 52 is defined by the inner surface 32. The downward extension 58 may be substantially axially aligned with the inner surface 32 or spaced outwardly of surface 32. The downward extension is preferably spaced outwardly of the inner surface 32 to increase the open area around support assembly 20. As is shown in FIG. 1, in the present embodiment the downward extension extends continuously around the circumference of the chamber 12. The extension 58 does not significantly interfere with the gas flow since it does not protrude beyond the profile of the plenum body 52. However, the downward extension 58 may be replaced by a plurality of downward extending fingers to further increase the open area around the support assembly 20 if desired.

Fingers 62 allow the nozzles 34 to be positioned close to the support assembly 20 without significantly interfering with the flow of gases and plasma through the chamber, improving the efficiency of the processing operation. When the vacuum pump is axially aligned with the chamber 12, the fingers 62 are preferably circumferentially spaced to preserve the symmetrical flow of gases around the support assembly 20. However, it is to be understood that the actual placement of fingers 62 is subject to considerable variation.

In the present embodiment, plenum body 52 includes an outer portion 64 supported on a horizontally-extending ledge 65 of the chamber wall 16 and a removable inner portion 66. The inner portion 66 is secured to the outer portion by suitable fastening means such as a threaded fastener 67. Preferably, several threaded fasteners are spaced circumferentially around the plenum body 52. The mating surfaces of the outer portion 64 and the inner portion 66 are cooperatively shaped to define the plenums 52. A plurality of seal members 68 are compressed between the inner and outer portions of the plenum body 52 to isolate the plenums and prevent gas leakage between the plenums and between the plenums and the chamber 12. It is to be understood that the construction of plenum body 52 is subject to considerable variation and is not to be limited to the configuration shown in FIG. 4.

The desired film uniformity, film composition, gas utilization (the amount of supplied chemicals actually reaching the wafer surface) and wafer surface profile for a particular application may be obtained through the modification of such factors as the number of nozzles, the position of the nozzles 34 relative to the wafer, the virtual injection point, and the injection vector. Each of these four factors are subject to considerable variation to provide the desired result, taking into account the vacuum pressure, the gas species and the ion energy.

The position of each nozzle relative to the wafer is defined by the radial distance r FIG. 5) between the nozzle and the axis of the wafer, the height z (FIG. 5) of the wafer above the wafer plane, and the angular position θ (FIG. 3) of the nozzle around the wafer circumference. In actual operation, the location where the injected gas disperses, herein referred to as the virtual injection point, is different from the injection point of the nozzle. The distance the injected gas travels from the nozzle 34 before dispersing is determined primarily by the mean free path of the gas species at the operating pressure. At a pressure of about 2 mTorr, the mean free path for molecules having a molecular weight of about 30, for example silane and oxygen, is about 2.5 cm. Preferably, the actual location of the nozzles 34 is selected to position the virtual injection point associated with each nozzle at the desired location relative to the wafer. FIGS. 4 and 5 illustrate an embodiment of injection assembly 10 which is particularly suitable for the deposition of a silicon dioxide film. The injection assembly includes twelve to thirty-six nozzles 34. The nozzles are spaced about 2 cm to 5 cm above the wafer plane and about 2 cm to 4 cm from the outer edge of the wafer, locating the virtual injection point at the desired position relative to the wafer surface. With silane and oxygen having a mean free path of about 2.5 cm in a 2 mTorr atmosphere, the location of the virtual injection point is an important variable to consider when determining the placement of the nozzles.

The injection vector is defined by the location of the nozzle 34 (or, more specifically the location of the virtual injection point) and the injection angle β is injected relative to a horizontal plane. The angle β may be zero, with the gas being injected in direction substantially planar to the wafer surface. The angle β may also be selected to aim the gas stream toward a specific portion of the wafer. The desired film profile may be obtained by orienting the individual nozzles to provide different injection angles β. For example, the injection vector of some of the nozzles is generally directed toward the near side of the wafer while the injection vector of other nozzles is directed generally toward the far side of the wafer.

As is shown schematically in FIG. 5, gas injection assembly 10 includes three plenums 42a, 42b, and 42c each coupled to a separate gas source 46. For high density, plasma-enhanced chemical vapor deposition, the first and third plenums 42a and 42c are coupled to a source of argon and silane while the second plenum 42b is coupled to a source of oxygen. However, various other gaseous substances may be used depending upon the processing employed in chamber 12. Using two or more plenums 42 offers increased flexibility in controlling the radial profile of the deposited film as well as the rate of film development.

The gases may be supplied at different flow rates to selected nozzles. The nozzles 34a associated with the first plenum 42a are substantially directed toward the area of the wafer closest to the nozzles 34a. The processing gases supplied from nozzles 34a generally produce the wafer profile shown in FIG. 6A, with the film along the edges of the wafer having a greater thickness than the film in the center of the wafer. The nozzles 34c associated with the third plenum 42c are directed toward the edge of the wafer opposite the nozzles 34c, producing the film profile shown in FIG. 6B which is thicker in the center of the wafer than along the wafer edges. Preferably, a higher flow rate is used with the orientation of nozzles 34c than with nozzles 34a. Some of the nozzles 34b coupled to the second plenum 42b are directed toward the proximal edge of the wafer while others are directed toward the distal edge of the wafer. By simultaneously operating nozzles 34a, 34b and 34c during processing, a film having a substantially uniform thickness may be obtained as is shown in FIG. 6C. Thus, the separate plenums 42a and 42c and the orientation of nozzles 34a and 34c may be used to significantly improve the uniformity of the radial profile of the film.

FIGS. 7A–7C illustrate examples of nozzle which may be incorporated in injection system 10. The nozzles 34 generally include an inlet 70, an outlet 72 and an inner wall 74 extending between the inlet 70 and the outlet 74. The maximum flow rate of the gases through the nozzle is obtained where the cross-sectional area of the nozzle is a minimum. FIG. 7A shows a conventional profile in which the cross-sectional area of the nozzle 34 is constant. In the illustrated embodiment, the cylindrical nozzle has an inner diameter of about 0.2 mm to 0.3 mm. Gas acceleration occurs at the inlet 70, with the inner wall 74 of the nozzle restricting the flow through the nozzle. The maximum velocity which may be achieved with this nozzle profile is generally less than the sonic velocity of the gaseous substance.

FIG. 7B shows a tapered nozzle profile in which the nozzle 34 has a minimum cross-sectional area at the outlet 72. In the present embodiment, the inlet 70 has a diameter of about 1.4 mm to 1.6 mm and the outlet 72 has a diameter of about 0.2 mm to 0.3 mm. The flow rate density increases continuously as the gas travels through the nozzle, reaching a maximum at the outlet 74. This nozzle may be used to achieve a flow rate of up to the sonic gaseous substance.

A preferred nozzle profile is shown in FIG. 7C. The minimum cross-sectional area of the nozzle 34 is located between the inlet 70 and the outlet 72. In one embodiment of the invention, the inlet 70 and outlet 72 have a diameter of about 0.5 mm to 0.7 mm and the nozzle has a minimum diameter of about 0.2 mm to 0.3 mm. The nozzle shown in FIG. 7C allows for the selection of a dispersion angle α which may be used to concentrate the spray of gas on the wafer surface.

The gas injection system 10 of this invention may be used with subsonic nozzles, sonic nozzles or supersonic nozzles depending upon the application and the desired velocity of deposition. For plasma-enhanced chemical vapor deposition processes, the nozzle profile shown in FIG. 7C provides greater control over the flow rate of the gaseous substances through the nozzles in that both subsonic and supersonic flow of the gas may be achieved. With the profile shown in FIG. 7B, the rate of deposition is limited by the sonic velocity of the gas. By increasing the gas flow to a supersonic rate, the velocity of the deposition process may be dramatically increased. The ability to achieve supersonic flow is of particular advantage with high density plasma enhanced processes where the operating pressure of the system is less than 3–4 mTorr. The ability to obtain a desired dispersion angle α is also of particular advantage with plasma-enhanced processes.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A gas injection system for delivering a gaseous substance to a semiconductor processing chamber comprising:
   a plenum body mountable in a processing chamber and having at least one plenum formed therein, said plenum having at least one supply inlet for delivery of a gaseous substance to said plenum,
   a plurality of nozzles for injecting said gaseous substance into the processing chamber, said nozzles being spaced from said plenum, and
   a plurality of indirect conduits each extending between said plenum and at least one of said nozzles for transporting said gaseous substance along an indirect path from said plenum to said nozzles, said indirect conduits directing the flow of said gaseous substance in at least two different flow directions to interrupt the flow of said gaseous substance between said plenum and said nozzle such that said gaseous substance in uniformly transported from said plenum to said nozzle independent of the location of said nozzles relative to said supply inlet.

2. The gas injection system of claim 1 in which said indirect conduit includes at least one bend in said indirect conduit for redirecting the flow of said gaseous substance before said gaseous substance is delivered to said at least one of said nozzles.

3. The gas injection system of claim 1 in which said plenum has an annular configuration.

4. The gas injection system of claim 1 in which said plenum body has a second plenum formed therein, and further comprising a plurality of second nozzles coupled to said second plenum for delivering a second gaseous substance to said chamber.

5. The gas injection system of claim 4 in which the first-mentioned nozzles are oriented to substantially inject said gaseous substance in a first direction and said second nozzles are oriented to substantially inject said second gaseous substance in a second direction different from said first direction.

6. The gas injection system of claim 4 in which the first-mentioned nozzles define a first injection plane and said second nozzles define a second injection plane spaced from said first plane.

7. The gas injection system of claim 1 in which said plenum body has a plurality of plenums formed therein.

8. The gas injection system of claim 1 in which said indirect conduits include at least a first channel and a second channel, said first channel extending from said plenum in a first direction and said second channel extending from said first channel in a second direction orientated at an angle relative to the first direction.

9. The gas injection system of claim 8 in which said second channel is substantially perpendicular to said first channel.

10. The gas injection system of claim 1 in which said indirect conduits have an inner cross-sectional area less than the inner cross-sectional area of said plenum and greater than the inner cross-sectional area of said nozzles.

11. In combination, the gas injection system of claim 1 and a processing chamber, said plenum body being mounted in said processing chamber, said processing chamber having an operational pressure of no greater than 4 mTorr.

12. A system for injecting a gaseous substance into a chamber for semiconductor processing comprising:
    a plenum body having a plurality of plenums formed therein, said plenums each having a supply inlet for delivery of a gaseous substance thereto,
    a plurality of first nozzles coupled to a first one of said plenums for injecting said gaseous substance into said processing chamber, said first nozzles being oriented at a first angle relative to a horizontal plane to inject said gaseous substance supplied to said first plenum toward the edge of a substrate located on the same side of the chamber as said first nozzle, and
    a plurality of second nozzles coupled to a second one of said plenums for injecting said gaseous substance into said processing chamber, said second nozzles being oriented at a second angle relative to a horizontal plane to inject said gaseous substance supplied to said second plenum toward the edge of the substrate located on the opposite side of the chamber from said second nozzle.

13. The system of claim 12, and further comprising indirect conduits extending between at least one of said plenums and the associated ones of said nozzles, said indirect conduits defining an indirect passageway for transporting said gaseous substance from said at least one of said plenums to at least one of the associated ones of said nozzles, said indirect conduits directing the flow of said gaseous substance in at least two different flow direction to interrupt the flow of said gaseous substance between said plenum and said nozzle such that said gaseous substance is uniformly transported from said plenum to said nozzle independent of the location of said nozzles relative to said supply inlet.

14. The system of claim 13 in which said indirect conduits include at least two conduit sections extending between said at least one of said plenums and at least one of the associated ones of said nozzles, each of said conduit sections being oriented at an angle relative to an adjacent conduit section.

15. The system of claim 13, which the inner diameter of said indirect conduits are less than the inner diameter of said at least one of said plenums.

16. The system of claim 13 in which said indirect conduits include at least one bend in said indirect conduits for redirecting the flow of said gaseous substance before said gaseous substance is delivered to said at least one of said nozzles.

17. The system of claim 12 in which said first one of said plenums and said second one of said plenums are each coupled to a source of silane and argon and said plenum body includes a third plenum coupled to a source of oxygen.

18. The system of claim 12 in which one of said plenums is coupled to a first source and another of said plenums is coupled to a second source, said first source and said second source supplying said gaseous substance at different flow rates.

19. A gas injection system for delivering a gaseous substance to a semiconductor processing chamber comprising:
    a plenum body mountable in a processing chamber and having at least one plenum formed therein, said plenum having at least one supply inlet for delivery of a gaseous substance to said plenum,
    a plurality of nozzles for injecting said gaseous substance into the processing chamber, said nozzles being spaced from said plenum, and
    a plurality of indirect conduits extending between said plenum and said nozzles for transporting said gaseous substance along an indirect path configured to interrupt the flow of said gaseous substance such that said gaseous substance is uniformly distributed to said nozzles independent of the location of said nozzle relative to said supply inlet, said indirect conduits including at least a first channel and a second channel, said first channel extending from said plenum in a first direction and said second channel extending from said second channel in a second direction oriented at an angle relative to the first direction.

20. The gas injection system of claim 19 in which said second channel is substantially perpendicular to said first channel.

21. The gas injection system of claim 19 in which said first and second channels have inner cross-sectional areas greater than the inner cross-sectional areas of said nozzles.

22. In combination, the gas injection system of claim 19 and a processing chamber, said plenum body being mounted in said processing chamber, said processing chamber having an operational pressure of no greater than 4 mTorr.

* * * * *